US007852880B2

(12) United States Patent
Solomon et al.

(10) Patent No.: US 7,852,880 B2
(45) Date of Patent: Dec. 14, 2010

(54) PROVISION OF TDM SERVICE OVER GPON USING VT ENCAPSULATION

(75) Inventors: David Solomon, River Vale, NJ (US); Stephen J. Brolin, Livingston, NJ (US)

(73) Assignee: Fujitsu Limited, Kawasaki (JP)

( * ) Notice: Subject to any disclaimer, the term of this patent is extended or adjusted under 35 U.S.C. 154(b) by 379 days.

(21) Appl. No.: 11/637,808

(22) Filed: Dec. 13, 2006

(65) Prior Publication Data
US 2007/0211763 A1  Sep. 13, 2007

Related U.S. Application Data

(60) Provisional application No. 60/749,577, filed on Dec. 13, 2005.

(51) Int. Cl.
*H04J 3/00* (2006.01)
(52) U.S. Cl. .................. 370/498; 370/395.51; 370/389; 370/401; 398/51; 398/58; 398/68
(58) Field of Classification Search ................ 370/442, 370/498, 466, 389, 432; 398/51
See application file for complete search history.

(56) References Cited
U.S. PATENT DOCUMENTS

| 4,046,193 | A | 9/1977 | Dougherty |
| 4,557,225 | A | 12/1985 | Sagues |
| 4,720,850 | A | 1/1988 | Oberlander |
| 4,858,069 | A | 8/1989 | Hughes |
| 5,105,336 | A | 4/1992 | Jacoby |
| 5,280,191 | A | 1/1994 | Chang |
| 5,636,215 | A | 6/1997 | Kubo |
| 5,748,445 | A | 5/1998 | North |
| 5,812,373 | A | 9/1998 | Hwang |
| 5,812,528 | A | 9/1998 | VanDervort |
| 5,825,621 | A | 10/1998 | Giannatto |
| 5,829,514 | A | 11/1998 | Smith |
| 5,831,830 | A | 11/1998 | Mahler |
| 5,867,494 | A | 2/1999 | Krishnaswamy |
| 5,867,495 | A | 2/1999 | Elliott |

(Continued)

FOREIGN PATENT DOCUMENTS

KR  2004063453  7/2004

OTHER PUBLICATIONS

International Search Report and a Written Opinion issued on Oct. 31, 2008 in the corresponding International PCT/US2006/047374 application.

(Continued)

*Primary Examiner*—Ricky Ngo
*Assistant Examiner*—Rasheed Gidado
(74) *Attorney, Agent, or Firm*—Hanify & King, P.C.

(57) ABSTRACT

The present invention provides TDM service, such as DS1, E1, or DS3, in a GPON system that is cost-effective, flexible, and that is easily configured and reconfigured. A system for telecommunications comprises circuitry operable to receive time division multiplexed data traffic, circuitry operable to form Virtual Tributary encapsulated data traffic including the time division multiplexed data traffic, circuitry operable to transmit the Virtual Tributary encapsulated data traffic, circuitry operable to receive the Virtual Tributary encapsulated data traffic, and circuitry operable to extract the time division multiplexed data traffic from the Virtual Tributary encapsulated data traffic.

10 Claims, 7 Drawing Sheets

U.S. PATENT DOCUMENTS

| | | | |
|---|---|---|---|
| 5,953,207 | A | 9/1999 | Aakalu |
| 6,002,585 | A | 12/1999 | Leeb |
| 6,038,129 | A | 3/2000 | Falaki |
| 6,047,002 | A | 4/2000 | Hartmann |
| 6,101,090 | A | 8/2000 | Gates |
| 6,434,000 | B1 | 8/2002 | Pandolfi |
| 6,532,088 | B1 | 3/2003 | Dantu |
| 6,614,758 | B2 | 9/2003 | Wong |
| 6,621,818 | B1 | 9/2003 | Szczepanek |
| 6,671,818 | B1 | 12/2003 | Mikurak |
| 6,789,191 | B1 | 9/2004 | Lapstun |
| 6,972,959 | B2 | 12/2005 | Asai |
| 6,985,467 | B2 | 1/2006 | Lomp et al. |
| 7,020,111 | B2 | 3/2006 | Ozluturk et al. |
| 7,046,679 | B2 | 5/2006 | Sampath |
| 7,085,281 | B2 | 8/2006 | Thomas et al. |
| 7,095,611 | B2 | 8/2006 | Kunz |
| 7,103,807 | B2 | 9/2006 | Bosa |
| 7,124,101 | B1 | 10/2006 | Mikurak |
| 7,133,415 | B2 * | 11/2006 | Zelig et al. ............ 370/466 |
| 7,154,755 | B2 | 12/2006 | Araujo |
| 7,158,380 | B2 | 1/2007 | Green |
| 7,245,628 | B2 | 7/2007 | Shi et al. |
| 7,277,443 | B2 | 10/2007 | Goode |
| 7,283,519 | B2 | 10/2007 | Girard |
| 7,322,850 | B2 | 1/2008 | Neer |
| 7,376,136 | B2 | 5/2008 | Song |
| 7,403,477 | B2 | 7/2008 | Takeuchi |
| 7,428,211 | B2 | 9/2008 | Yu |
| 7,492,719 | B2 | 2/2009 | Lim |
| 7,512,147 | B2 | 3/2009 | Sato |
| 7,599,620 | B2 | 10/2009 | Graves |
| 2002/0059637 | A1 | 5/2002 | Rakib |
| 2002/0085548 | A1 | 7/2002 | Ku |
| 2002/0141159 | A1 | 10/2002 | Bloemen |
| 2002/0196792 | A1 * | 12/2002 | McNeil et al. .......... 370/401 |
| 2002/0196811 | A1 * | 12/2002 | Park et al. ............ 370/474 |
| 2003/0091267 | A1 | 5/2003 | Alvarez |
| 2004/0064351 | A1 | 4/2004 | Mikurak |
| 2004/0107169 | A1 | 6/2004 | Lowe |
| 2004/0177161 | A1 | 9/2004 | Hoang |
| 2004/0190548 | A1 * | 9/2004 | Harel et al. ............ 370/466 |
| 2004/0202470 | A1 * | 10/2004 | Lim et al. ............. 398/51 |
| 2005/0008013 | A1 * | 1/2005 | Jamieson et al. ........ 370/389 |
| 2005/0013314 | A1 * | 1/2005 | Lim et al. ............. 370/432 |
| 2005/0099949 | A1 | 5/2005 | Mohan |
| 2005/0100015 | A1 | 5/2005 | Eubanks |
| 2005/0180749 | A1 | 8/2005 | Koley |
| 2005/0198247 | A1 | 9/2005 | Perry |
| 2006/0098578 | A1 | 5/2006 | Mallya |
| 2006/0120389 | A1 | 6/2006 | Sampath |
| 2006/0209825 | A1 | 9/2006 | Carroll et al. |
| 2006/0285536 | A1 | 12/2006 | Pauwels |
| 2007/0025370 | A1 | 2/2007 | Ghasem et al. |
| 2007/0070997 | A1 | 3/2007 | Weitz et al. |
| 2007/0109974 | A1 | 5/2007 | Cutillo et al. |
| 2007/0136743 | A1 | 6/2007 | Hasek |
| 2007/0136777 | A1 | 6/2007 | Hasek |
| 2008/0068807 | A1 | 3/2008 | Horng |

OTHER PUBLICATIONS

Final Office Action dated Sep. 30, 2009 issued in U.S. Appl. No. 11/637,037.
Non-Final Office Action dated Mar. 11, 2009 issued in U.S. Appl. No. 11/637,037.
Non-Final Office Action dated May 7, 2009 issued in U.S. Appl. No. 11/637,023.
Final Office Action dated Dec. 3, 2009 issued in U.S. Appl. No. 11/637,023.
Non-Final Office Action dated Apr. 17, 2008 issued in U.S. Appl. No. 11/637,840.
Notice of Allowance dated Aug. 13, 2008 issued in U.S. Appl. No. 11/637,840.
Non-Final Office Action dated Sep. 16, 2009 issued in U.S. Appl. No. 11/637,807.
Non-Final Office Action dated Jul. 23, 2009 issued in U.S. Appl. No. 11/637,041.
Notice of Allowance dated Nov. 9, 2009 issued in U.S. Appl. No. 11/637,842.
Non-Final Office Action dated May 14, 2009 issued in U.S. Appl. No. 11/637,842.
Non-Final Office Action dated Apr. 2, 2009 issued in U.S. Appl. No. 11/637,807.
IEEE Std 802.3ad-2000, "Aggregation of Multiple Link Segments", Mar. 30, 2000, IEEE, all pages.
Paul Congdon, "Load Balancing Algorithms", Feb. 4, 1998, IEEE Aggregate Study Group, all pages.
Final Office Action dated Feb. 1, 2010 issued in U.S. Appl. No. 11/637,807.
Final Office Action dated Mar. 29, 2010 received in U.S. Appl. No. 11/637,041.
Final Office Action dated Feb. 1, 2010 received in U.S. Appl. No. 11/637,807.
Non-Final Office Action dated May 18, 2010 received in U.S. Appl. No. 11/637,023.
Notice of Allowance dated Jun. 24, 2010 received in U.S. Appl. No. 11/637,037.
International Search Report dated Feb. 19, 2008 received in PCT/US06/47379.
Notice of Allowance received in U.S. Appl. No. 11/637,037 dated Sep. 16, 2010.

* cited by examiner

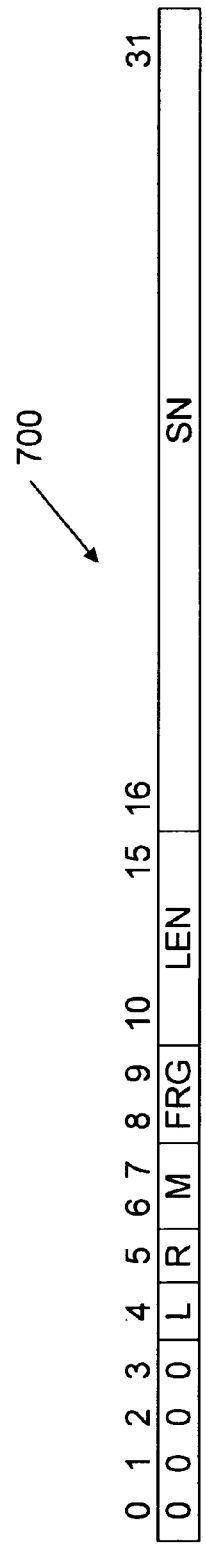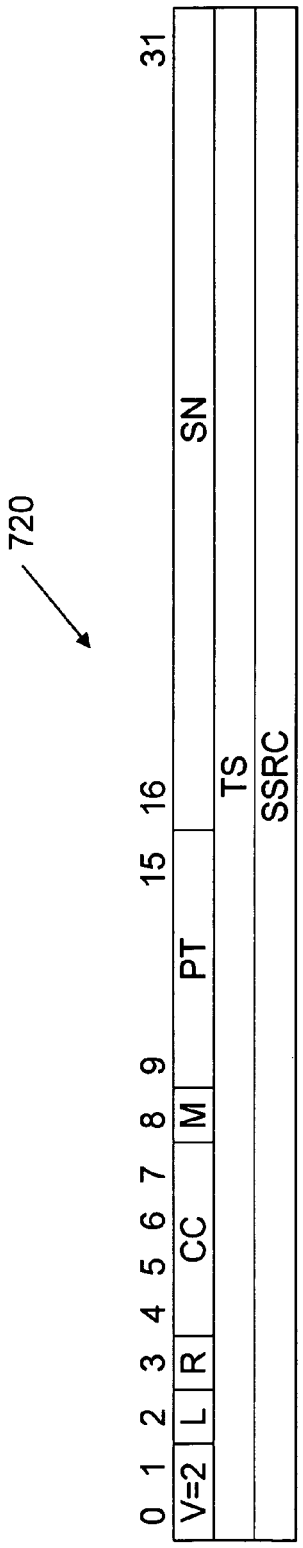

PROVISION OF TDM SERVICE OVER GPON USING VT ENCAPSULATION

CROSS-REFERENCE TO RELATED APPLICATIONS

This application claims the benefit of provisional application 60/749,577, filed Dec. 13, 2005, the entirety of which is incorporated herein by reference.

BACKGROUND OF THE INVENTION

1. Field of the Invention

The present invention relates to a system for providing TDM service, such as DS1, in a GPON system using Virtual Tributary (VT) encapsulation.

2. Background of the Prior Art

A Passive Optical Network (PON) is a point-to-multipoint, fiber to the premises network architecture in which unpowered optical splitters are used to enable a single optical fiber to serve multiple premises, typically 32. A PON consists of an Optical Line Termination (OLT) at the service provider's central office and a number of Optical Network Units (ONUs) near end users. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, typically time division multiple access (TDMA). The OLTs "range" the ONUs in order to provide time slot assignments for upstream communication.

There are a number of standard types of PON that have been implemented. APON (ATM Passive Optical Network) was the first Passive optical network standard. It was used primarily for business applications, and was based on ATM. BPON (Broadband PON) is a standard based on APON. It adds support for WDM, dynamic and higher upstream bandwidth allocation, and survivability. GPON (Gigabit PON) is an evolution of BPON. It supports higher rates, enhanced security, and choice of Layer 2 protocol (ATM, GEM, Ethernet). GPON represents a significant boost in both the total bandwidth and bandwidth efficiency through the use of larger, variable-length packets. A GPON network delivers up to 2,488 megabits per second (Mbit/s) of downstream bandwidth, and 2,488 Mbit/s of upstream bandwidth. GPON Encapsulation Method (GEM) allows very efficient packaging of user traffic, with frame segmentation to allow for higher Quality of Service (QoS) for delay-sensitive traffic such as voice and video communications.

One type of service that is important for business applications is the Digital Signal 1 (DS1) service. DS1 provides twenty-four 8-bit channels, each channel being a 64 kbit/s multiplexed pseudo-circuit, for a total throughput of 1.544 Mbit/s. However, the cost of a GPON system must be optimized for residential service. This includes the cost of the ONU and the allocated share of the OLT. While the business application uses a special ONU, the OLT is common to both business and residential service, thus it is important to provide the capability to serve a significant number of DS1's without embedding significant cost in the OLT. While there will be a future need to provide DS1 service over packet service to the network interface, there will still be an important application to hand off DS1's via SONET encapsulation. Thus, a need arises for a technique by which DS1 service can be provided in a GPON system that is cost-effective, flexible, and that is easiy configured and reconfigured.

SUMMARY OF THE INVENTION

The present invention provides DS1 service in a GPON system that is cost-effective, flexible, and that is easily configured and reconfigured. Flexibility is provided in the ONU to map DS1's to enable either SONET or Packet network handoffs at the OLT. DS1's from the customer can either be synchronous (loop timed from the network) or asynchronous (not loop timed from the network). Asynchronous format is most general and most difficult-since allowed variations in frequency need to be accommodated by some version of bit stuffing.

The concept here is to encapsulate the customer's DS1 into a VT1.5 superframe at the business ONU. While the DS1 is asynchronous, the VT1.5 encapsulation is network timed and synchronous. Since VT1.5 is also the DS1 encapsulation for SONET handoffs—the OLT doesn't need to handle individual DS1's—remove GPON encapsulation, provide jitter filtering, and re-encapsulate. Instead the OLT maps these synchronous VT1.5 superframes into SONET frames.

Downstream—the SONET frames from the SONET network are de-multiplexed to individual VT1.5 superframes and sent down to the business ONUs which remove the VT1.5 encapsulation, and recover the native DS1 signal.

A system for telecommunications comprises circuitry operable to receive time division multiplexed data traffic, circuitry operable to form Virtual Tributary encapsulated data traffic including the time division multiplexed data traffic, circuitry operable to transmit the Virtual Tributary encapsulated data traffic, circuitry operable to receive the Virtual Tributary encapsulated data traffic, and circuitry operable to extract the time division multiplexed data traffic from the Virtual Tributary encapsulated data traffic. The time division multiplexed data traffic may be DS1, E1, or DS3 data traffic. The circuitry operable to form Virtual Tributary encapsulated data traffic may comprise circuitry operable to encapsulate the DS1, E1, or DS3 data traffic using VT1.5 encapsulation. The circuitry operable to transmit the Virtual Tributary encapsulated data traffic may comprise an optical network. The circuitry operable to transmit the Virtual Tributary encapsulated data traffic may comprise a Gigabit Passive Optical Network. The system may further comprise circuitry operable to encapsulate the Virtual Tributary encapsulated data traffic with Ethernet encapsulation. The system may further comprise circuitry operable to decapsulate the Ethernet encapsulation to form Virtual Tributary encapsulated data traffic. The circuitry operable to extract the time division multiplexed data traffic from the Virtual Tributary encapsulated data traffic may comprise circuitry operable to map the Virtual Tributary encapsulated data traffic to Synchronous Optical Network data traffic.

BRIEF DESCRIPTION OF THE DRAWINGS

FIG. 7a is an exemplary format of a structure of the CESo-ETH control word shown in FIG. 6b.

FIG. 7b is an exemplary format of an optional RTP Header Structure shown in FIG. 5.

DETAILED DESCRIPTION OF THE PREFERRED EMBODIMENTS

Figure 1:
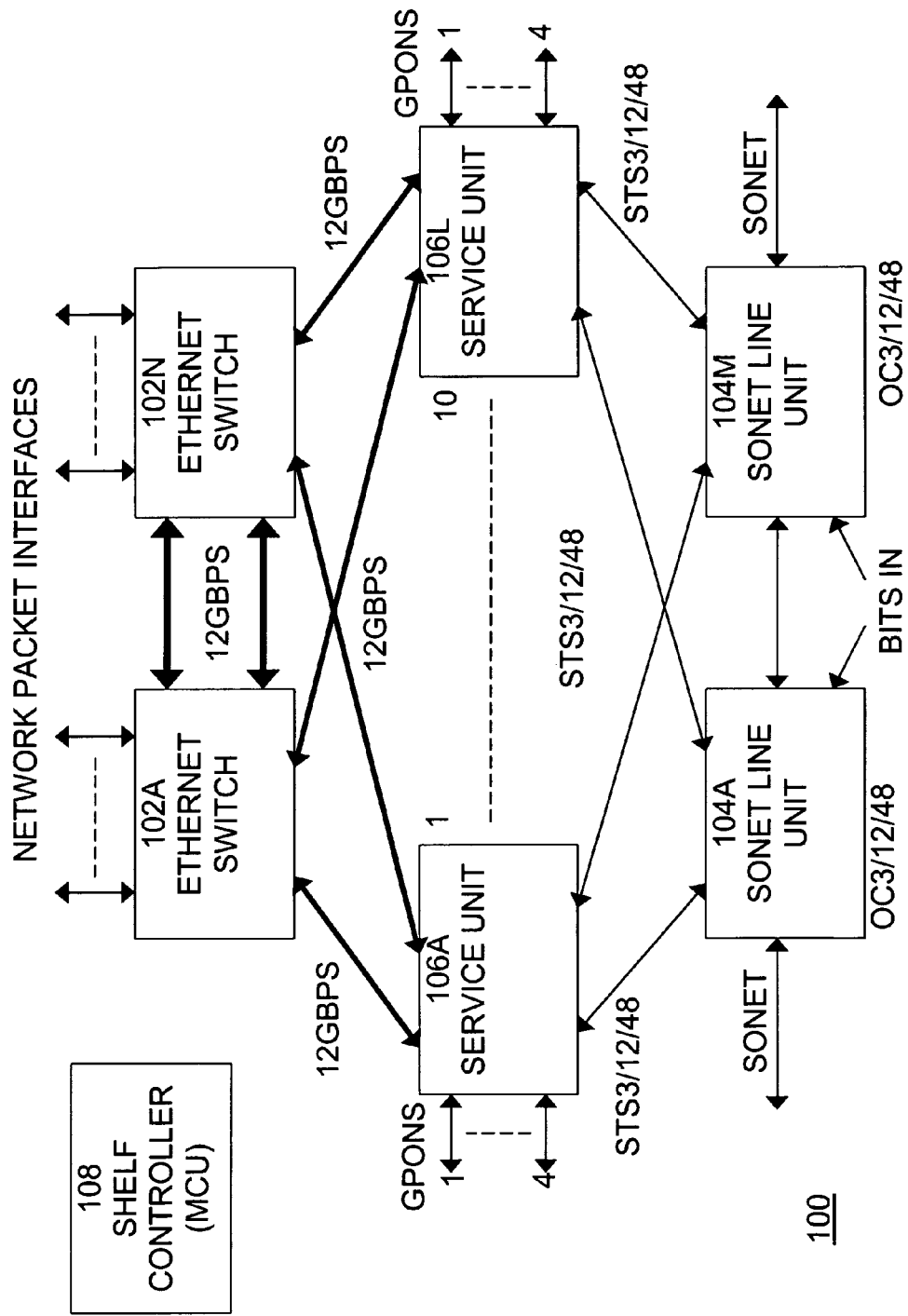
FIG. 1 is an exemplary block diagram of an optical network unit, in which the present invention may be implemented.

The present invention provides DS1 service in a GPON system that is cost-effective, flexible, and that is easily configured and reconfigured. Flexibility is provided in the ONU to map DS1s, E1s, DS3s, etc., to enable either SONET or Packet network handoffs at the OLT. DS1's from the customer can either be synchronous (loop timed from the network) or asynchronous (not loop timed from the network). Asynchronous format is most general and most difficult—since allowed variations in frequency need to be accommodated by some version of bit stuffing.

The concept here is to encapsulate the customer's DS1 into a VT1.5 superframe at the business ONU. While the DS1 is asynchronous, the VT1.5 encapsulation is network timed and synchronous. Since VT1.5 is also the DS1 encapsulation for SONET handoffs—the OLT doesn't need to handle individual DS1's—remove GPON encapsulation, provide jitter filtering, and re-encapsulate. Instead the OLT maps these synchronous VT1.5 superframes into SONET frames.

Downstream—the SONET frames from the SONET network are de-multiplexed to individual VT1.5 superframes and sent down to the business ONUs which remove the VT1.5 encapsulation, and recover the native DS1 signal.

Although, for simplicity, the present invention is described in using DS1 as an example, it is to be noted that this is merely an example. The present invention contemplates application to DS1, E1, DS3, etc., and any Time Division Multiplexed (TDM) data stream.

An example of an optical network unit (ONU) 100, in which the present invention may be implemented, is shown in FIG. 100. Network 100 includes a plurality of switches, such as Ethernet switches 102A-N, a plurality of SONET line units 104A-M, a plurality of service units 106A-L, and shelf controller 108. The ONU 100 provides the interface between the customer's data, video, and telephony networks and the GPON. The primary function of the ONU 100 is to receive traffic in an optical SONET/SDH format and convert it to the end user's desired format (Ethernet, IP multicast, POTS, T1, etc.) and to receive traffic from the end user and convert it to an optical SONET/SDH format. Alternatively, the end user's format could also be in a SONET format, such as EC1.

A network switch, such as an Ethernet switch 102A-N is a networking device that performs transparent bridging (connection of multiple network segments with forwarding based on MAC addresses) at full wire speed in hardware. The use of specially designed hardware also makes it possible to have large numbers of ports. A switch can connect Ethernet, Token Ring, Fibre Channel or other types of packet switched network segments together to form a heterogeneous network operating at OSI Layer 2 (though there may be complications caused by the different MTUs of the standards).

SONET line units 104A-M (LUs), provide communication interface with the SONET network, while service units 106A-L (SUs), provide communication with the GPON networks. Each LU 104A-M typically provides timing control, SONET frame pulse reference, and may contain optical interfaces to transmit part of all of the SONET data on the GPON network to the SONET network, to supplement data fed directly to the SONET network by the OLT.

Figure 2:
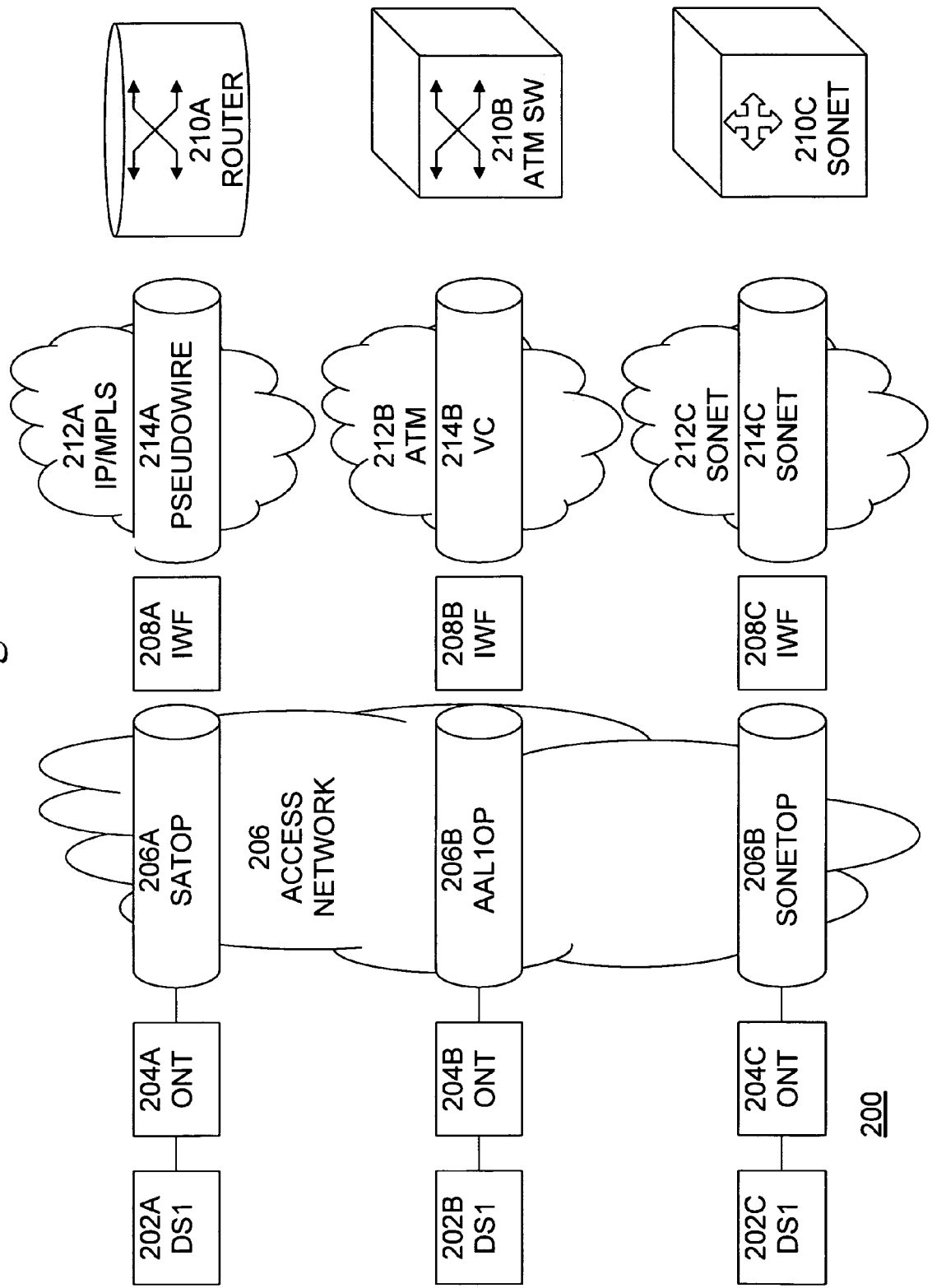
FIG. 2 is an exemplary block diagram of a system in which the present invention may be implemented.

A block diagram of a system 200 in which the present invention may be implemented is shown in FIG. 2. In this example, native traffic is encapsulated at the ONT into a format optimized for handoff to the transport network. For example, DS1 services 202A-C are provided to end users via ONTs 204A-C. The ONTs 204A-C connect to access network 206, such as a PON, which may be or may include one or more access protocols. For example, ONT 204A connects to a SAT protocol over PON access network 206A. ONT 204B connects to an ATM Adaptation Layer 1 (AAL1) protocol over PON access network 206B, which supports constant bit rate (CBR), synchronous, connection oriented traffic, such as T1 (DS1), E1, and ×64 kbit/s emulation. ONT 204C connects to a SONET protocol over PON access network 206C. Each access network connects to an IWF 208A-C, which is connected to a router or switch 210A-C via network 212A-C. For example, IWF 208A receives SAT over PON protocol data, reformats it and transmits it to router 210A over Internet Protocol/Multi-protocol Label Switching (IP/MPLS) network 212A using a connection such as pseudo-wire connection 214A. IWF 208B receives AAL1 over PON protocol data, reformats it and transmits it to ATM switch 210B over ATM network 212B using a connection such as virtual connection (VC) 214B. IWF 208C receives SONET over PON protocol data, reformats it and transmits it to SONET router 210C over SONET network 212C using SONET connection 214C.

Figure 3:
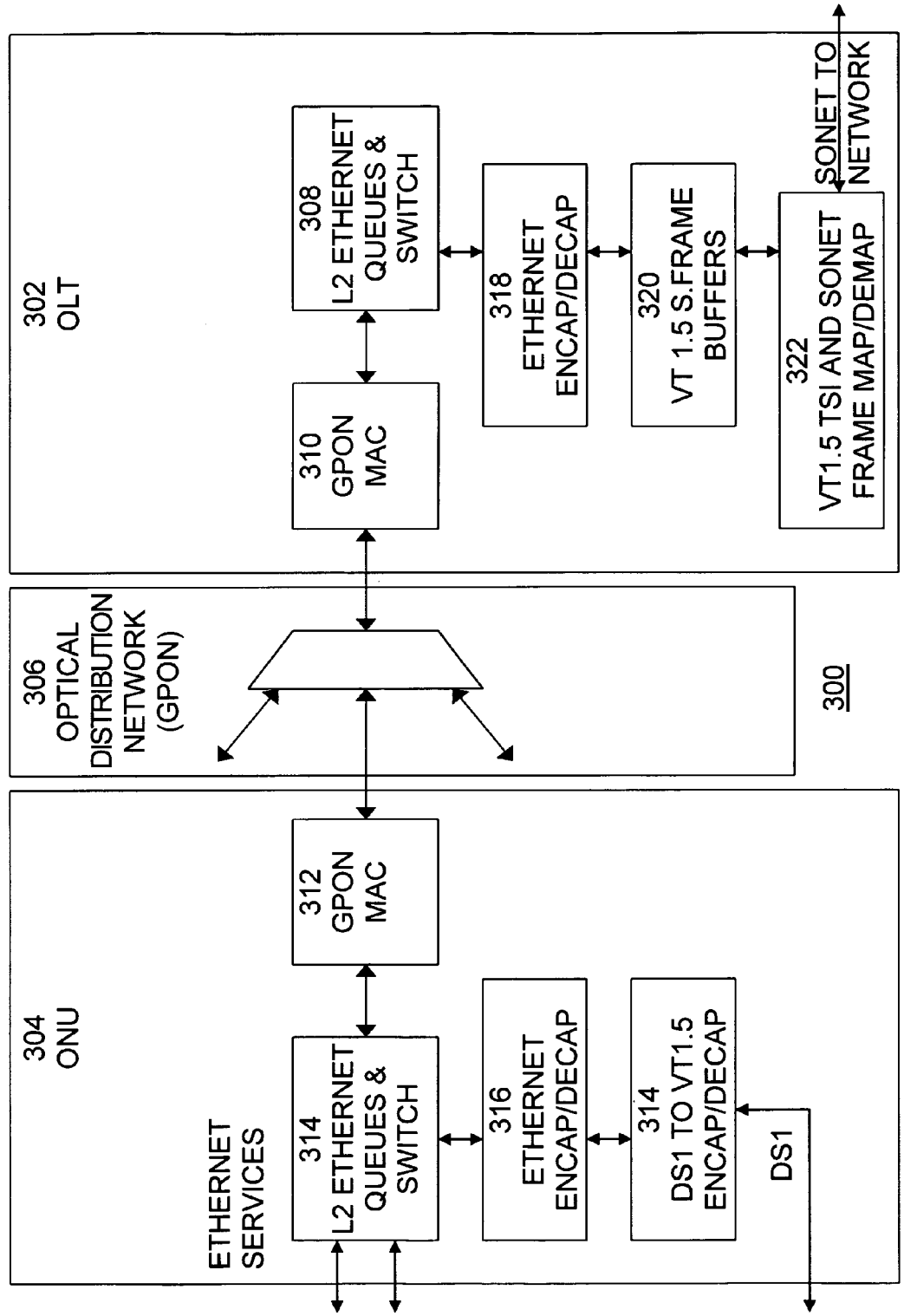
FIG. 3 is an exemplary block diagram of a system in which the present invention may be implemented.

An exemplary block diagram of a system 300 in which the present invention may be implemented is shown in FIG. 3. System 300 includes an OLT 302, an ONU 304, and an optical distribution network 306. Optical distribution network 306 is typically a passive optical network, such as a GPON. OLT 302 provides an interface between one or more other distribution networks (not shown) and network 306 and provides an interface for data to be transmitted over the GPON 306. For example, OLT 302 may provide an interface between a SONET network (not shown) and a GPON 306. GPON 306 is typically connected to multiple ONUs 304. The ONU provides the interface between the customer's data, video, and telephony networks (not shown) and the GPON 306. The primary function of the ONU is to receive traffic in an optical format and convert it to the customer's desired format.

In the example shown in FIG. 3, OLT 302 includes one or more Layer 2 (L2) Ethernet queues and switch 308, which handles data traffic between other connected distribution networks (not shown) and GPON 306. Ethernet queues and switch 308 communicates with GPON 306 via GPON Media Access Control block (MAC) 310. The. MAC data communication protocol sub-layer is the part of the seven-layer OSI model data link layer (layer 2). It provides addressing and channel access control mechanisms that makes it possible for several terminals or network nodes to communicate within a multipoint network, such as GPON 306. The MAC sub-layer acts as an interface between the Logical Link Control sub-layer and the network's physical layer. The MAC layer provides an addressing mechanism called physical address or MAC address, which is a unique serial number assigned to each network adapter.

GPON 306 is a point-to-multipoint, fiber to the customer network architecture in which unpowered optical splitters are used to enable a single optical fiber to serve multiple customer locations. A PON configuration reduces the amount of fiber and central office equipment required compared with point to point architectures. Downstream signals are broadcast to each premises sharing a fiber. Encryption is used to prevent eavesdropping. Upstream signals are combined using a multiple access protocol, invariably time division multiple access (TDMA). The OLTs "range" the ONUs in order to provide time slot assignments for upstream communication. GPON (Gigabit PON) supports higher rates, enhanced security, and choice of Layer 2 protocol (ATM, GEM, Ethernet). It also created a standard management interface, called OMCI, between the OLT and ONU/ONT, enabling mixed-vendor networks.

ONU 304 includes GPON MAC 312 and L2 Ethernet queues and switch 314, which handles data traffic between connected customer networks (not shown) and GPON 306. Ethernet queues and switch 308 communicates with GPON 306 via GPON Media Access Control block (MAC) 310.

In system 300, VT1.5 is used to encapsulate and transport DS1 data traffic through the system between the DS1 users and the SONET network. VT1.5 is a type of virtual tributary in SONET. SONET bandwidth is defined in multiples of an OC-1/STS-1 each of which can transport up to 51.84 Mbit/s. However, it is frequently desirable to address much smaller portions of bandwidth. To meet this need, sub-STS1 facilities called Virtual Tributaries have been defined. In North America, the VT1.5 is the most common virtual tributary because it can carry 1.728 Mbit/s; just enough room for a DS1/T1 signal. Some SONET systems offer the capability to switch at the VT1.5 level. Such equipment is able to re-arrange the data payloads so that inbound VT1.5s are placed into a completely different set of outbound STSs than the ones they arrived in. Among other things, this allows the bandwidth usage to be optimized and facilitates a cleaner network design.

In system 300, DS1 data traffic is communicated via block 314, in which DS1 to VT1.5 encapsulation is performed on received DS1 data traffic and VT1.5 to DS1 decapsulation is performed on transmitted DS1 data traffic. In block 316, Ethernet encapsulation is performed on received VT1.5 data traffic from block 314 and the Ethernet encapsulated, VT1.5 encapsulated data traffic is transmitted via Ethernet switch 314. Likewise, in block 316, Ethernet encapsulated, VT1.5 encapsulated data traffic is received from Ethernet switch 314, the Ethernet encapsulation is decapsulated, and the VT1.5 encapsulated data traffic is transmitted to block 314.

Ethernet encapsulated, VT1.5 encapsulated data traffic is communicated between Ethernet switch 314 and Ethernet switch 308 via GPON 306. At Ethernet switch 308, Ethernet encapsulated, VT1.5 encapsulated data traffic is communicated between Ethernet switch 308 and block 318. In block 318, Ethernet encapsulation is performed on received VT1.5 data traffic from block 320 and the Ethernet encapsulated, VT1.5 encapsulated data traffic is transmitted via Ethernet switch 308. Likewise, in block 318, Ethernet encapsulated, VT1.5 encapsulated data traffic is received from Ethernet switch 308, the Ethernet encapsulation is decapsulated, and the VT1.5 encapsulated data traffic is transmitted to block 320. Since VT1.5 is also the DS1 encapsulation for SONET handoffs, the OLT doesn't need to handle individual DS1 data streams. Rather, the OLT need only map synchronous VT1.5 superframes into SONET frames. Block 320 includes VT1.5 Superframe buffers which store VT1.5 Superframes received from block 318. Block 322 maps the stored received VT1.5 Superframes into SONET frames for transmission over the SONET network. Likewise, block 322 receives SONET frames from the SONET network and demaps them into VT1.5 Superframes. The demapped superframes are then stored in VT1.5 Superframe buffers 320 for transmission to block 318.

Figure 4:
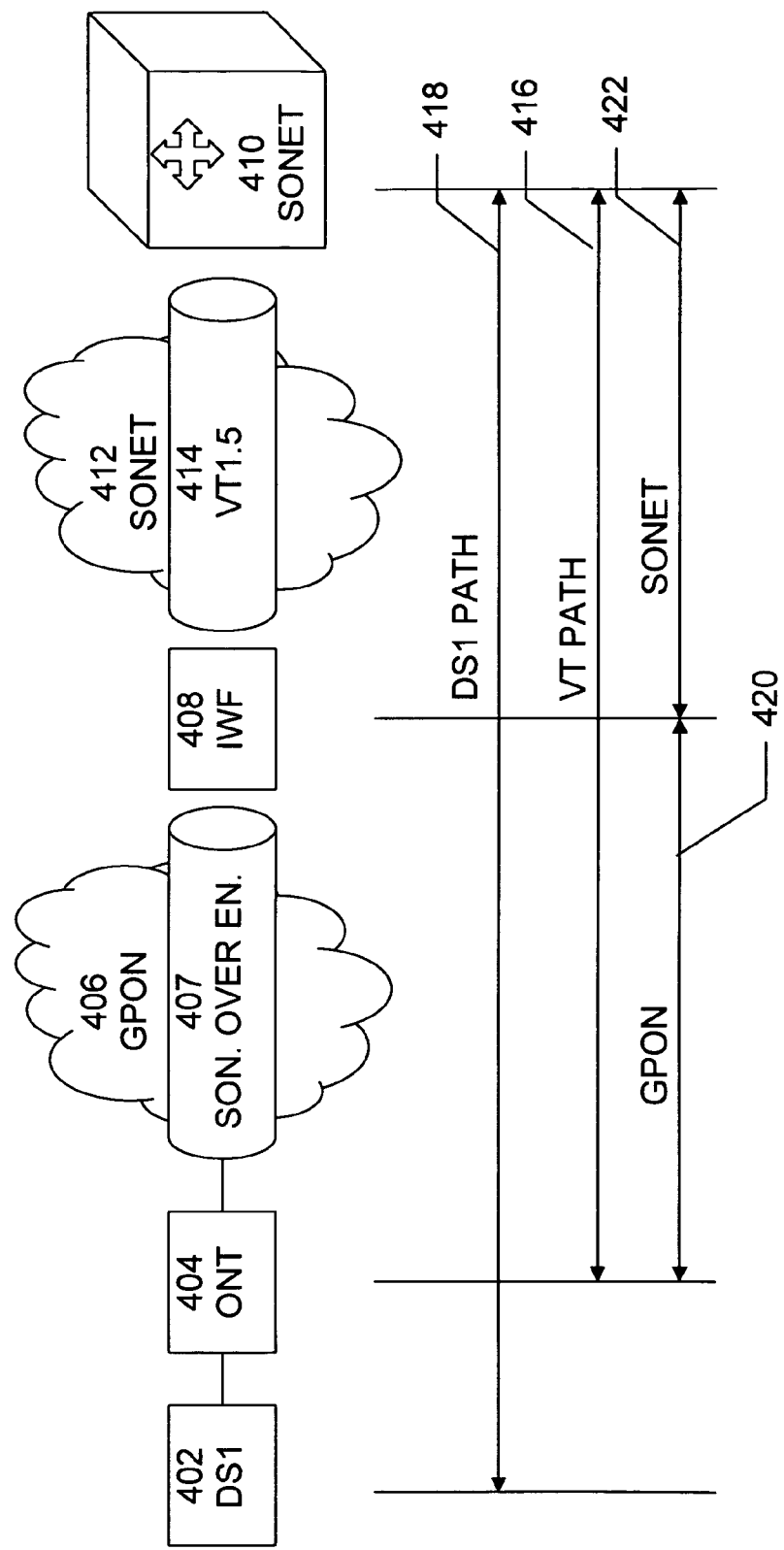
FIG. 4 is an exemplary flow diagram of the operation of the systems shown in FIGS. 2 and 3 for DS1 to SONET transport network data traffic.

An example of the operation of the systems shown in FIGS. 2 and 3 for DS1 to SONET transport network data traffic is shown in FIG. 4. DS1 services 402 are provided to end users via ONT 404. The ONT 404 connects to GPON access network 206, which may be or may include one or more access protocols, such as a SONET over Ethernet access protocol 407. IWF 408 receives SONET over Ethernet protocol data, reformats it and transmits it to SONET router 410 over SONET network 412 using VT1.5 connection 414.

As shown, the SONET network VT path layer 416 is extended to the customer premises. Asynchronous DS1 402 is mapped at ONT 404 into a VT Synchronous Payload Envelope. The VT structure (with pointers) is encapsulated into Ethernet frames with adaptation headers per MEF8 (VT structure locked, SPE indicated). A GPON Encapsulation Method (GEM) header is added for transport over GPON 406. Thus, the DS1 path 418 is provided from DS1 services 402 to SONET router 410, over VT1.5 path 416, and over GPON path 420 and SONET path 422. A similar approach is applicable for E1 DS3 etc.

Figure 5:
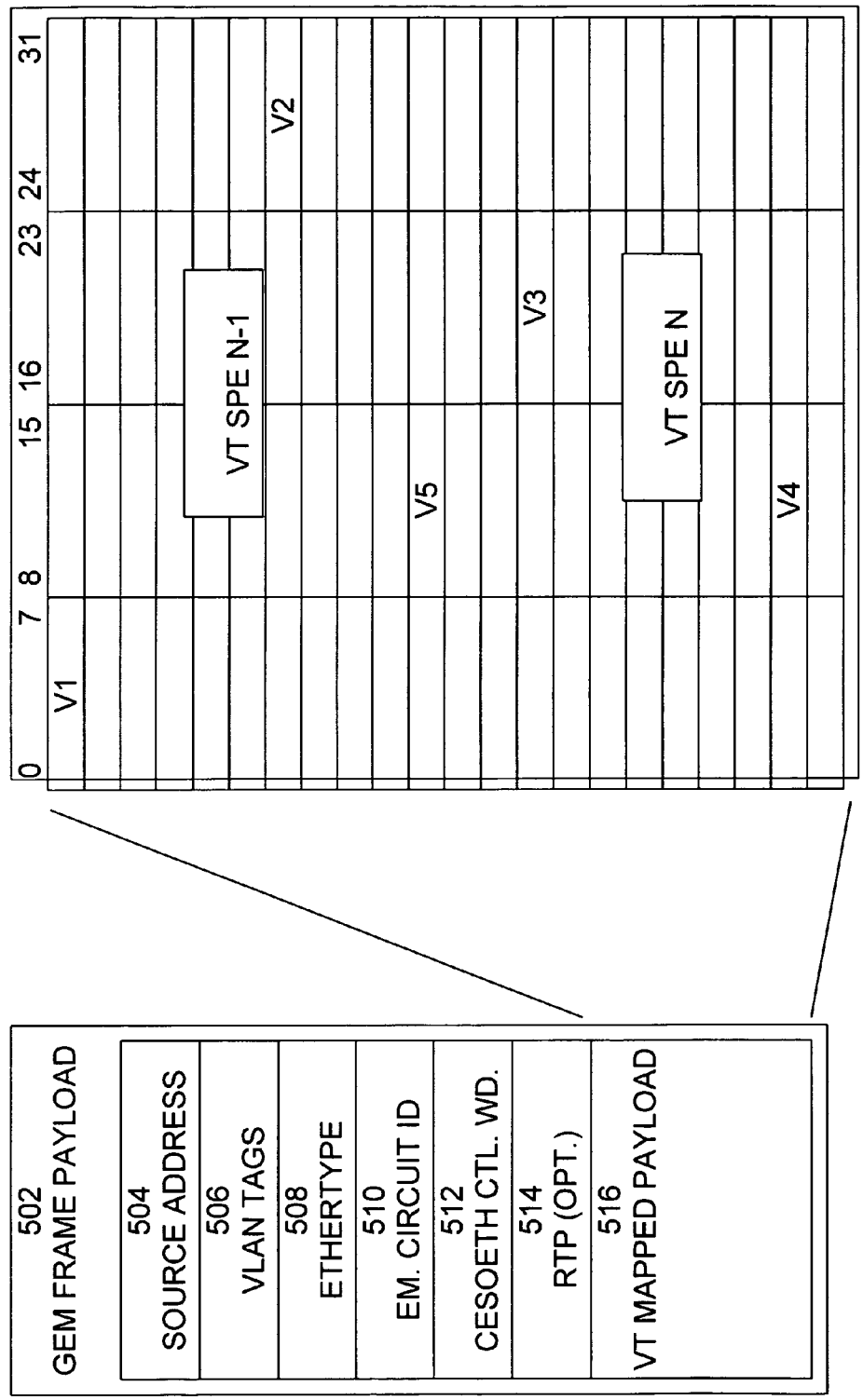
FIG. 5 is an exemplary format of payload mapping in a GEM frame payload.

An exemplary format of payload mapping in a GEM frame payload 502 is shown in FIG. 5. GEM frame payload 502 includes source address 504, Virtual Local Area Network (VLAN) tags 506, Ethertype 508, Emulated Circuit Identifier 510, CESoETH Control Word 512, optional RTP 514, and VT1.5 mapped payload 516. VT1.5 mapped payload 516 is shown in more detail and includes pointer in V1 and V2 which indicate the location of V5 which is the start of an SPE. In the upstream direction, V5 will be at fixed location. In downstream direction, the offset may change due to pointer adjustments in the SONET network.

Figure 6A:
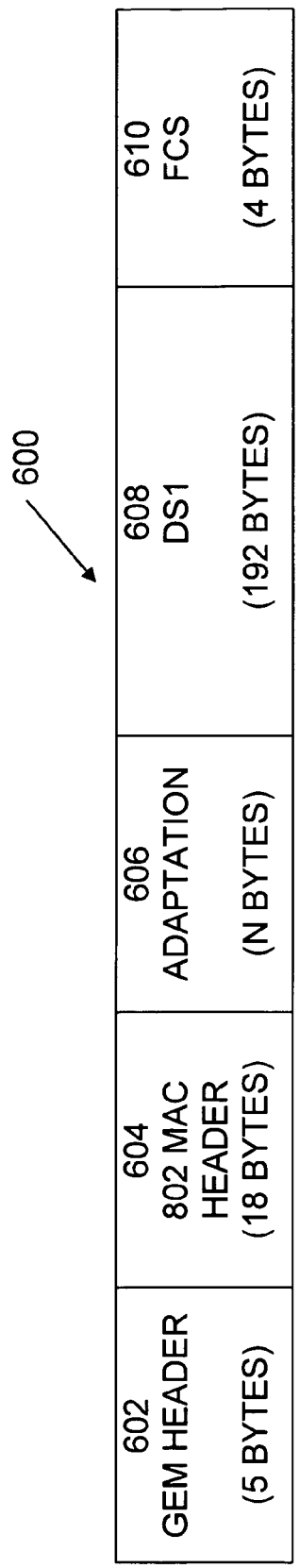
FIG. 6a is an exemplary format of a DS1 structure agnostic GPON frame.

An exemplary format of a DS1 structure agnostic GPON frame 600 is shown in FIG. 6a. Frame 600 includes GEM header 602, 802 MAC header 604, adaptation data 606, DS1 structure 608, and FCS 610. This example is agnostic to the DS1 structure because the DS1 structure is simply transported as-is within the GPON frame 600.

Figure 6B:
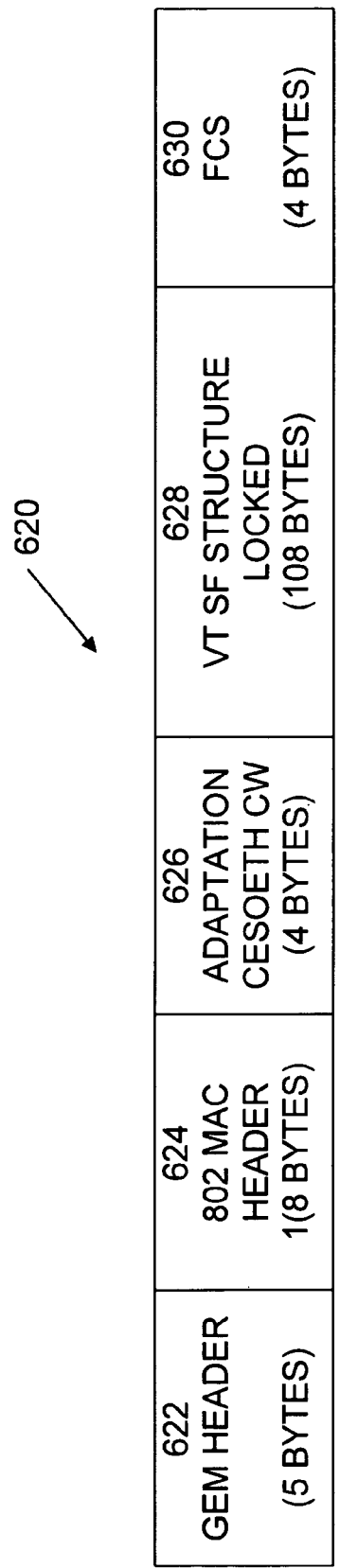
FIG. 6b is an exemplary format of a DS1 structure agnostic GPON frame with a locked VT1.5 structure.

An exemplary format of a DS1 structure agnostic GPON frame 620 with a locked VT1.5 structure is shown in FIG. 6b. Frame 620 includes GEM header 602, 802 MAC header 604, adaptation data (in this example, a CESoETH Control Word) 606, VT Superframe structure locked 608, and FCS 610. In this example, Ethernet encapsulation and an MEF CESoETHHeader are used. ONTs that support DS1 service should be configurable to support at least two these two encapsulation methods. Both methods above are DS1 agnostic and support synchronous or asynchronous DS1s. These formats provide the capability to keep the OLT simple for handoff to the transport network. Additional complexity is added at the ONT, not the OLT. The ONT should use VT encapsulation, such as that shown in FIG. 6b, if the data traffic is destined for a SONET transport network, while the ONT should use DS1 agnostic pseudo-wire encapsulation, such as that shown in FIG. 6a, if the data traffic is destined for packet transport.

An exemplary format 700 of a structure of the CESoETH control word 626, shown in FIG. 6b, is shown in FIG. 7a. The CESoETH control word includes bits indicating:

L: Local TDM failure,

R: Remote Loss of Frames indication,

M: Modifier bits, which supplement the meaning of the L bit,

Frg: used for fragmenting multi-frame structures into multiple CESoETHframes,

Len: length (if padded), and

SN: Sequence number.

An exemplary format 720 of an optional RTP Header Structure 514 (defined in RFC 3550), shown in FIG. 5, is shown in FIG. 7b. The RTP Header Structure includes bits indicating:

V: RTP version,
P: padding,
X: extension,
CC: CSRC count,
M: marker,
PT: payload type,
SN: Sequence number,
TS: Timestamp, and
SSRC: Synchronization Source.

The present invention provides multiple options for transporting TDM, such as DS1 over GPON. The 802.1ad Service Provider encapsulation is used to allow for standard xMII interfacing to MAC devices while allowing service provider marking for Priority and Discard Eligibility. MEF8 header are used for Circuit emulation adaptation functions. The payload of 802.1ad frame is optimized for the intended Network handoff type. The VT mapped payload allows efficient handoff to a SONET Network. The cost of retiming asynchronous DS1 circuits is eliminated. The VT path is kept intact from termination point to termination.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

The invention claimed is:

1. A system for telecommunications comprising:
   first circuitry operable to receive time division multiplexed data traffic, perform Virtual Tributary encapsulation on the time division multiplexed data traffic, and perform Ethernet encapsulation on the Virtual Tributary encapsulated time division multiplexed data traffic;
   a first Ethernet switch to receive the Ethernet encapsulated Virtual Tributary encapsulated time division multiplexed data traffic from the first circuitry and transmit the Ethernet encapsulated Virtual Tributary encapsulated time division multiplexed data traffic to a first Passive Optical Network Media Access Control block;
   the first Passive Optical Network Media Access Control block to receive the Ethernet encapsulated Virtual Tributary encapsulated time division multiplexed data traffic from the first Ethernet switch and transmit the Ethernet encapsulated Virtual Tributary encapsulated time division multiplexed data traffic over a Passive Optical Network;
   the Passive Optical Network to transmit the Ethernet encapsulated Virtual Tributary encapsulated time division multiplexed data traffic;
   a second Passive Optical Network Media Access Control block to receive the Ethernet encapsulated Virtual Tributary encapsulated time division multiplexed data traffic from the Passive Optical Network and transmit the Ethernet encapsulated Virtual Tributary encapsulated time division multiplexed data traffic to a second Ethernet switch;
   the second Ethernet switch to receive the Ethernet encapsulated Virtual Tributary encapsulated time division multiplexed data traffic from the second Passive Optical Network Media Access Control block and transmit the Ethernet encapsulated Virtual Tributary encapsulated time division multiplexed data traffic to second circuitry;
   the second circuitry operable to receive the Ethernet encapsulated Virtual Tributary encapsulated time division multiplexed data traffic, and extract the time division multiplexed data traffic from the Ethernet encapsulated Virtual Tributary encapsulated time division multiplexed data traffic.

2. The system of claim 1, wherein the time division multiplexed data traffic is DS1, E1, or DS3 data traffic.

3. The system of claim 1, wherein the Passive Optical Network comprises a Gigabit Passive Optical Network.

4. The system of claim 1, wherein the second circuitry further decapsulates the Ethernet encapsulated Virtual Tributary encapsulated time division multiplexed data traffic to Virtual Tributary encapsulated time division multiplexed data traffic.

5. The system of claim 4, wherein the second circuitry maps the Virtual Tributary encapsulated time division multiplexed data traffic to Synchronous Optical Network data traffic.

6. A method for telecommunications comprising:
   receiving time division multiplexed data traffic, performing Virtual Tributary encapsulation on the time division multiplexed data traffic, and performing Ethernet encapsulation on the Virtual Tributary encapsulated time division multiplexed data traffic at a first circuitry;
   receiving the Ethernet encapsulated Virtual Tributary encapsulated time division multiplexed data traffic from the first circuitry at a first Ethernet switch and transmitting the Ethernet encapsulated Virtual Tributary encapsulated time division multiplexed data traffic from the first Ethernet switch to a first Passive Optical Network Media Access Control block;
   receiving the Ethernet encapsulated Virtual Tributary encapsulated time division multiplexed data traffic from the first Ethernet switch at the first Passive Optical Network Media Access Control block;
   transmitting the Ethernet encapsulated Virtual Tributary encapsulated time division multiplexed data traffic over a Passive Optical Network with the first Passive Optical Network Media Access Control block; and
   receiving the Ethernet encapsulated Virtual Tributary encapsulated time division multiplexed data traffic from the Passive Optical Network at a second Passive Optical Network Media Access Control block and transmitting the Ethernet encapsulated Virtual Tributary encapsulated time division multiplexed data traffic to a second Ethernet switch from the second Passive Optical Network Media Access Control block;
   receiving the Ethernet encapsulated Virtual Tributary encapsulated time division multiplexed data traffic from the second Passive Optical Network Media Access Control block at the second Ethernet switch and transmitting the Ethernet encapsulated Virtual Tributary encapsulated time division multiplexed data traffic to second circuitry;
   receiving the Ethernet encapsulated Virtual Tributary encapsulated time division multiplexed data traffic, and extracting the time division multiplexed data traffic from the Ethernet encapsulated Virtual Tributary encapsulated time division multiplexed data traffic at the second circuitry.

7. The method of claim 6, wherein the time division multiplexed data traffic is DS1, E1, or DS3 data traffic.

8. The method of claim 6, wherein transmitting the time division multiplexed data traffic from the Ethernet encapsulated Virtual Tributary encapsulated time division multiplexed data traffic comprises transmitting the time division multiplexed data traffic from the Ethernet encapsulated Virtual Tributary encapsulated time division multiplexed data traffic over a Gigabit Passive Optical Network.

9. The method of claim 6, further comprising decapsulating the Ethernet encapsulated Virtual Tributary encapsulated time division multiplexed data traffic to Virtual Tributary encapsulated time division multiplexed data traffic.

10. The method of claim 9, further comprising mapping the Virtual Tributary encapsulated time division multiplexed data traffic to Synchronous Optical Network data traffic.

* * * * *